United States Patent [19]
Heim et al.

[11] Patent Number: 6,034,875
[45] Date of Patent: Mar. 7, 2000

[54] COOLING STRUCTURE FOR ELECTRONIC COMPONENTS

[75] Inventors: Craig G. Heim, Kirkwood; Wade Leslie Hooker; Ajit Kumar Trivedi, both of Endicott, all of N.Y.

[73] Assignee: International Business Machines Corporation, Armonk, N.Y.

[21] Appl. No.: 09/098,977

[22] Filed: Jun. 17, 1998

[51] Int. Cl.⁷ ...................................................... H05K 7/20
[52] U.S. Cl. .................... 361/719; 165/104.21; 165/185; 257/715; 361/700
[58] Field of Search .................................. 257/707, 714, 257/715; 361/696, 699, 700, 704, 707, 708, 717–719; 165/80.3, 80.4, 80.5, 185, 104.21, 104.33; 428/613, 614, 620, 665

[56] References Cited

U.S. PATENT DOCUMENTS

| | | |
|---|---|---|
| 4,233,645 | 11/1980 | Balderes . |
| 4,350,016 | 9/1982 | Beitner . |
| 5,224,017 | 6/1993 | Martin . |
| 5,284,286 | 2/1994 | Brofman et al. . |
| 5,323,294 | 6/1994 | Layton et al. . |
| 5,542,601 | 8/1996 | Fallon et al. . |
| 5,572,404 | 11/1996 | Layton et al. . |
| 5,660,917 | 8/1997 | Fujimori et al. . |
| 5,724,729 | 3/1998 | Sherif . |
| 5,847,927 | 12/1998 | Minning . |
| 5,979,205 | 11/1996 | Tustaniwskyj . |

Primary Examiner—Gerald Tolin
Attorney, Agent, or Firm—Schmeiser, Olsen & Watts; Lawrence R. Fraley

[57] ABSTRACT

A method and apparatus for cooling electrical components on a substrate during a rework process. A block of a porous, thermally conductive material, saturated with a liquid, is positioned on an electrical component to be cooled. During the rework processing of an adjacent electrical component, the liquid in the porous, thermally conductive block vaporizes, thereby maintaining the temperature of the electrical component below its reflow temperature. A second thermally conductive block, in thermal contact with the porous, thermally conductive block, and the substrate on which the electronic component to be cooled is attached, is positioned between the electronic component to be cooled and the electronic component undergoing rework. A supply of liquid is provided to the porous, thermally conductive block to maintain the temperature of the electronic component to be cooled at a predetermined level for a specified period of time.

17 Claims, 2 Drawing Sheets

COOLING STRUCTURE FOR ELECTRONIC COMPONENTS

FIELD OF THE INVENTION

The present invention is in the field of integrated circuits. More particularly, the present invention provides a method and apparatus for maintaining the temperature of adjacent electronic components below their solder reflow temperature during the rework processing of a primary electronic component.

BACKGROUND OF THE INVENTION

Electronic components, such as integrated circuit chips, are commonly attached to a substrate (e.g., a printed circuit board (PCB) or printed circuit card (PCC)) with solder ball connecters using a ball grid array (BGA) packaging technique. Occasionally, an electronic component may be found to be defective, and will therefore have to be removed and replaced with a functional electronic component using a rework process. In a conventional rework process, the defective electronic component is removed by first heating the solder material, used to connect the component's solder balls to corresponding contact pads on the substrate, to its melting, or "reflow" temperature. Then, the defective electronic component is pulled off the substrate and replaced. Unfortunately, during a rework process, enough heat may be transferred to adjacent electronic components, either directly or through the substrate, to unintentionally heat their solder connections beyond a reflow temperature. This may compromise, or even destroy, the connections between the affected adjacent electronic components and the substrate.

SUMMARY OF THE INVENTION

A block of a porous, thermally conductive material, saturated with a liquid, is positioned on an electrical component to be cooled. During the rework processing of an adjacent electrical component, the liquid in the porous, thermally conductive block vaporizes, thereby maintaining the temperature of the electrical component below its reflow temperature. A second thermally conductive block is positioned between the electronic component to be cooled and the electronic component undergoing rework. The second thermally conductive block is in thermal contact with the porous, thermally conductive block, and the substrate on which the electronic component to be cooled is attached. The second thermally conductive block acts both as a heat shield, absorbing and directing heat from the hot gases of the nearby rework process into the porous, thermally conductive block, and as a thermal shunt, wherein heat from the substrate is drawn away from the electrical component to be cooled and into the porous, thermally conductive block. A supply of liquid is provided to the porous, thermally conductive block to maintain the temperature of the electronic component to be cooled at a predetermined level for a specified period of time.

Generally, the present invention provides a cooling structure for electronic components, comprising:

an electrical component to be cooled, positioned on a substrate;

a second electrical component positioned on the substrate, the second electrical component having a higher temperature than the electronic component to be cooled;

a porous, thermally conductive body positioned on the electronic component to be cooled;

a second thermally conductive body, positioned between the electronic component to be cooled and the second electronic component, the second thermally conductive body in thermal contact with the substrate and the porous, thermally conductive body; and a quantity of a liquid having a specified boiling temperature located in the porous, thermally conductive body.

BRIEF DESCRIPTION OF THE DRAWINGS

The features of the present invention will best be understood from a detailed description of the invention and a preferred embodiment thereof selected for the purposes of illustration and shown in the accompanying drawings in which.

DETAILED DESCRIPTION OF THE INVENTION

Figure 1:
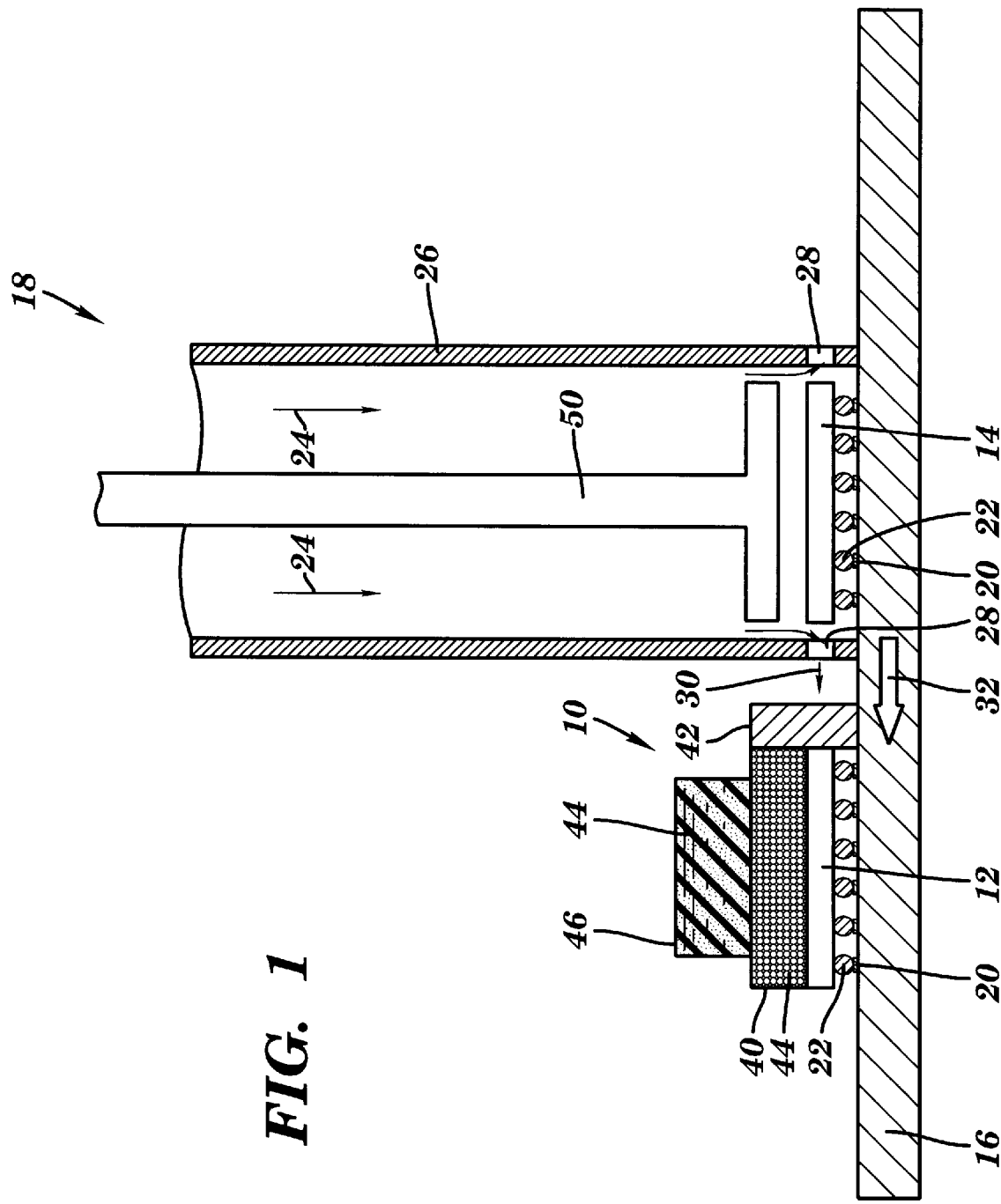
FIG. 1 illustrates a cooling structure for electrical components according to a preferred embodiments of the present invention.

The features and advantages of the present invention are illustrated in detail in the accompanying drawings, wherein like reference numerals refer to like elements throughout the drawings.

A cooling structure 10 for electrical components according to a preferred embodiment of the present invention is illustrated in detail in FIG. 1. In this example, the electrical components include first and second integrated circuit chips 12, 14, which have been previously attached to a substrate 16 (e.g., a PCB) using a BGA or similar technique. The second integrated circuit chip 14 has been found to be defective, and is in the process of being removed from the substrate 16 using a rework tool 18 of a type known in the art.

The solder material 20 connecting the solder balls 22 of the defective integrated circuit chip 14 to corresponding contact pads (not shown) on the substrate 16 is first heated to its reflow temperature using a heated flow of gas 24, preferably an inert gas such as nitrogen having a temperature of about 300–350° C. The heated flow of gas 24 is directed over and around the defective integrated circuit chip 14 through a housing 26 of the rework tool 18, ultimately passing out of the housing through openings 28. After the solder material 20 has reached its reflow temperature, a vacuum pickup assembly 50 or the like is used to pick up, remove, and replace the defective integrated circuit chip 14. Of course, the cooling structure 10 may be used in conjunction with other types of rework tools or processes without departing from the intended scope of the present invention as set forth in the accompanying claims.

Without the cooling structure 10 of the present invention, the heated flow of gas 24 used during the rework process may heat the solder material 20, connecting the integrated circuit chip 12 to the substrate 16, beyond its reflow temperature (i.e., causing a "secondary solder reflow"). Heat may be transferred to the solder material 20 directly by the heated flow of gas 24 after it passes out of the openings 28 formed in the housing 26 of the rework tool 18 (arrow 30), or indirectly through the substrate 16 (arrow 32). In the case where the substrate 16 is a PCB, for example, heat is transferred laterally through the substrate 16 to the integrated circuit chip 12 via the numerous internal circuitry and power planes commonly located in the PCB.

The cooling structure 10 of the present invention is configured to maintain the integrated circuit chip 12 at a temperature below the temperature at which secondary solder reflow will occur. As presented in greater detail below, this is achieved by reducing heat buildup at the integrated circuit chip 12 thru an evaporative process.

In accordance with a first, preferred embodiment of the present invention, the cooling structure 10 includes a porous, thermally conductive block 40 positioned on the integrated circuit chip 12, a second thermally conductive block 42 positioned between the defective integrated circuit chip 14 and the integrated circuit chip 12, and a quantity of a liquid 44 contained within the porous, thermally conductive block 40. The second thermally conductive block 42 extends between, and is in thermal contact with, the substrate 16 and the porous, thermally conductive block 40. In operation, heat is drawn away from the integrated circuit chip 12 and the substrate 16 into the porous, thermally conductive block 40, causing the liquid 44 contained therein to vaporize, thereby cooling the chip 12 and the substrate 16.

The porous, thermally conductive block 40 is preferably formed of a highly thermally conductive metal such as copper. The porous structure retains the liquid 44 within the block 40, and maximizes the surface area over which vaporization may occur, thereby maximizing the cooling efficiency of the block 40. The porous, thermally conductive block 40 may be produced using a sintering process or other suitable technique.

The porous, thermally conductive block 40 of the present invention may, of course, be formed of metals other than copper, or with other types of thermally conductive materials. Nonporous thermally conductive materials may also be used to form the block 40. In this case, vaporization of a supply of liquid on the surface of the block 40 results in the cooling of the chip 12 and the substrate 16.

The present invention is designed to reduce heat buildup in adjacent electronic components (e.g., integrated circuit chip 12) during the rework processing of a primary electronic component (e.g., defective integrated circuit chip 14) through an evaporative/cooling process by boiling off the liquid 44 contained within the porous, thermally conductive block 40. Preferably, the liquid 44 comprises water, although other liquids having suitable boiling points and vapor pressures may also be used. User selection of other liquids with different boiling points and vapor pressures will provide a range of cooling effects and maximum temperatures.

Figure 6:
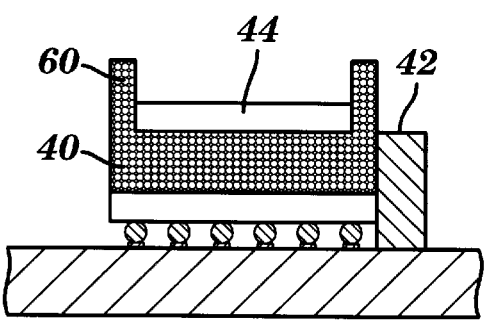

A supply of the liquid 44 is provided to the porous, thermally conductive block 40 to maintain the temperature of the integrated circuit chip 12 at a predetermined level for a specified period of time. As shown in FIG. 1, the liquid supply may be provided by positioning a sponge 46 or other absorbent material on the porous, thermally conductive block 40, and by saturating the sponge 46 with a quantity of the liquid 44. Other liquid supply means, such a liquid drip or the like, may also be used in accordance with the teaching of the present invention. For example, as illustrated in FIG. 6, a well 60 may be formed on or in the porous, thermally conductive block 40 to contain a quantity of the liquid 44. The walls of the well 60 may be formed of a porous or nonporous, thermally conductive material, integrally with the porous, thermally conductive block 40, or using separate blocks of material. Many other configurations are possible.

The second thermally conductive block 42 is preferably formed of a highly thermally conductive material such as copper or the like. As described above, the second thermally conductive block is positioned between the integrated circuit chip 12 to be cooled and the defective integrated circuit chip 14 undergoing rework. The second thermally conductive block 42 is in thermal contact with the substrate 16 and the porous, thermally conductive block 42 positioned on the integrated circuit chip 12.

In the present invention, the second thermally conductive block 42 provides several functions. First, the second thermally conductive block 42 acts as a heat shield, absorbing and preventing heat generated by the rework tool 18 from directly contacting the integrated circuit chip 12. Further, the second thermally conductive block 42 acts as a thermal shunt or "by-pass" by drawing heat out of the substrate 16 into the porous, thermally conductive block 40, where it is released in response to the vaporization of the liquid 44 contained therein.

Figure 2:
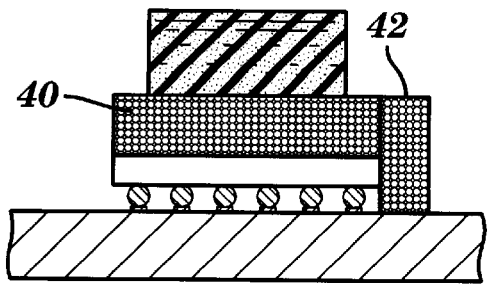
FIGS. 2–6 illustrate alternate embodiments of a cooling structure for electrical components according to the present invention.
Figure 3:
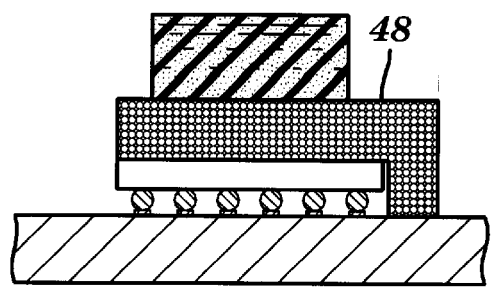
Figure 4:
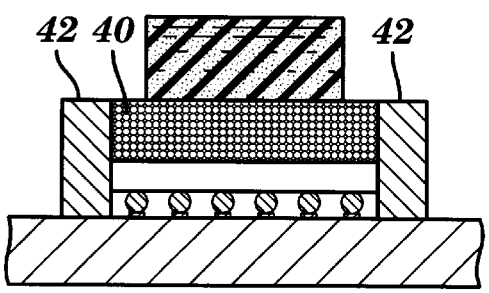
Figure 5:
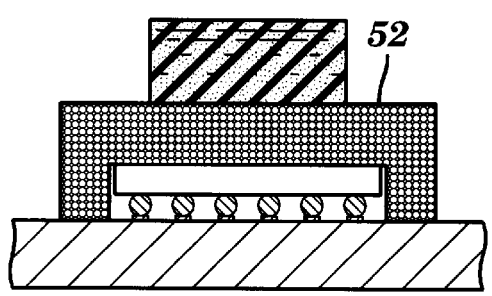

As illustrated in FIG. 2, the second thermally conductive block 42 may have a porous structure similar to that of the porous, thermally conductive block 40. As further illustrated in FIG. 3, a single thermally conductive structure 48, formed of a porous or nonporous material, may also be used. Finally, as illustrated in FIGS. 4 and 5, the cooling structure 10 of the present invention may be configured to cover and enclose (partially or completely) the integrated circuit chip 12 using a combination of the blocks 40, 42 (FIG. 4), or a single structure 52 (FIG. 5). Other configurations are also possible.

The foregoing description of the present invention has been presented for purposes of illustration and description. It is not intended to be exhaustive or to limit the invention to the precise form disclosed, and many modifications and variations are possible in light of the above teaching. Such modifications and variations that may be apparent to a person skilled in the art are intended to be included within the scope of this invention as defined by the accompanying claims.

We claim:

1. A cooling structure for electronic components, comprising:
   an electrical component to be cooled, positioned on a substrate;
   a second electrical component positioned on the substrate, the second electrical component having a higher temperature than the electronic component to be cooled;
   a porous, thermally conductive body positioned on the electronic component to be cooled;
   a second thermally conductive body, positioned between the electronic component to be cooled and the second electronic component, the second thermally conductive body in direct thermal contact with the substrate and the porous, thermally conductive body; and
   a quantity of a liquid located in the porous, thermally conductive body.

2. The cooling structure according to claim 1, further including:
   a mechanism for supplying the liquid to the porous, thermally conductive body.

3. The cooling structure according to claim 2, wherein the supplying mechanism is a sponge containing a quantity of the liquid.

4. The cooling structure according to claim 2, wherein the supplying mechanism is a well containing a quantity of the liquid and located on the porous, thermally conductive body.

5. The cooling structure according to claim 2, wherein the supplying mechanism is configured to supply a quantity of the liquid sufficient to maintain a temperature of the electrical component to be cooled at a predetermined level for a specified period of time.

6. The cooling structure according to claim 1, wherein the porous, thermally conductive body is formed of a porous metal.

7. The cooling structure according to claim 1, wherein the second thermally conductive body is formed of a porous, thermally conductive material.

8. The cooling structure according to claim 1, wherein the porous, thermally conductive body and the second thermally conductive body enclose the electrical component to be cooled.

9. The cooling structure according to claim 1, wherein the second thermally conductive body is configured to draw heat out of the substrate into the porous, thermally conductive body.

10. A cooling structure for electronic components, comprising:

an electrical component to be cooled, positioned on a substrate;

a porous, thermally conductive body positioned on the electronic component to be cooled;

a second thermally conductive body, positioned between the electronic component to be cooled and an electronic component undergoing rework processing, the second thermally conductive body in direct thermal contact with the substrate and the porous, thermally conductive body; and a quantity of a liquid located in the porous, thermally conductive body.

11. The cooling structure according to claim 10, wherein an evaporation of the liquid located in the porous, thermally conductive body provides the cooling of the electrical component to be cooled.

12. The cooling structure according to claim 10, further including:

a mechanism for supplying the liquid to the porous, thermally conductive body.

13. The cooling structure according to claim 12, wherein the supplying mechanism is a sponge containing a quantity of the liquid.

14. The cooling structure according to claim 12, wherein the supplying mechanism is a well containing a quantity of the liquid and located on the porous, thermally conductive body.

15. The cooling structure according to claim 12, wherein the supplying mechanism is configured to supply a quantity of the liquid sufficient to maintain a temperature of the electrical component to be cooled at a predetermined level for a specified period of time.

16. The cooling structure according to claim 10, wherein the porous, thermally conductive body is formed of a porous metal.

17. The cooling structure according to claim 10, wherein the second thermally conductive body is configured to draw heat out of the substrate into the porous, thermally conductive body.

* * * * *